(12) United States Patent
Takezoe et al.

(10) Patent No.: US 7,172,950 B2
(45) Date of Patent: Feb. 6, 2007

(54) METHOD FOR MANUFACTURING SEMICONDUCTOR CHIP

(75) Inventors: Kouji Takezoe, Kanagawa (JP); Akito Ichikawa, Kanagawa (JP); Koichi Tamura, Kanagawa (JP); Masahiko Kitamura, Tokyo (JP); Koichi Yajima, Tokyo (JP); Masatoshi Nanjo, Tokyo (JP); Shinichi Namioka, Tokyo (JP)

(73) Assignees: Kansai Paint Co., Ltd., Hyogo (JP); Disco Corporation, Tokyo (JP)

( * ) Notice: Subject to any disclaimer, the term of this patent is extended or adjusted under 35 U.S.C. 154(b) by 310 days.

(21) Appl. No.: 10/807,276

(22) Filed: Mar. 24, 2004

(65) Prior Publication Data
US 2004/0192012 A1    Sep. 30, 2004

(30) Foreign Application Priority Data
Mar. 27, 2003    (JP)    ............................. 2003-088036

(51) Int. Cl.
*H01L 21/00* (2006.01)
(52) U.S. Cl. .................................................... 438/460
(58) Field of Classification Search ........ 438/460–465; 430/192, 191
See application file for complete search history.

(56) References Cited
U.S. PATENT DOCUMENTS
5,518,860 A * 5/1996 Niikura et al. ............. 430/191
6,641,972 B2 * 11/2003 Misumi et al. ............. 430/192

FOREIGN PATENT DOCUMENTS
JP    2002-076101    3/2002

\* cited by examiner

*Primary Examiner*—Carl Whitehead, Jr.
*Assistant Examiner*—Monica D. Harrison
(74) *Attorney, Agent, or Firm*—Wenderoth, Lind & Ponack, L.L.P.

(57) ABSTRACT

In manufacturing thinned semiconductor chips by grinding a semiconductor wafer supported on a rigid support substrate, in order to remove the semiconductor wafer or semiconductor chips from the support substrate without damage to the semiconductor wafer or semiconductor chips, a semiconductor wafer at its surface is bonded on a light-transmissive support substrate through an adhesive layer having an adhesion force that is reduced upon exposure to light radiation, thereby exposing the back surface of the semiconductor wafer. A tape is bonded to the backside of the semiconductor wafer integrated with the support substrate after grinding, wherein the tape is supported at the periphery. Before or after bonding of the tape, light radiation is applied to the adhesive layer at a side close to the support substrate to reduce the adhesion force in the adhesion layer. Thereafter, the support substrate and adhesive layer is removed from the surface of the semiconductor wafer, leaving the semiconductor wafer held by the tape and frame. The semiconductor wafer supported by the tape and frame is cut at streets into individual semiconductor chips.

16 Claims, 12 Drawing Sheets

Ultraviolet radiation

METHOD FOR MANUFACTURING SEMICONDUCTOR CHIP

BACKGROUND OF THE INVENTION

1. Field of the Invention

The present invention relates to a method for manufacturing semiconductor chips while supporting a semiconductor wafer by use of a support substrate.

2. Related Art

The semiconductor wafer is formed with a plurality of circuits, such as ICs or LSIs. By dicing the wafer along streets on the surface thereof, the wafer is separated into a plurality of semiconductor chips that are to be used on a variety of electronic appliances.

The semiconductor wafer is formed in a desired thickness by grinding at the back surface thereof. Recently, in order to reduce the size and weight of electronic appliances, the semiconductor wafer is necessarily worked to a thickness of 100 μm or smaller, or 50 μm or smaller.

However, there is a setback that the thinned semiconductor wafer is as flexible as paper and hence is difficult to handle after grinding. For this reason, the semiconductor wafer is ground in a state bonded on a rigid support substrate, thereby facilitating the subsequent handling including transport (see JP-A-2002-76101, for example).

However, in order to dice a post-grinding semiconductor wafer, the semiconductor wafer bonded on a support substrate must be stripped off and re-bonded onto a dicing tape into one body with a dicing frame. Because the ground semiconductor wafer is reduced in thickness, the semiconductor wafer, particularly ground to a thickness of 100 μm or smaller, or 50 μm or smaller, is readily damaged when detached from the support substrate and re-bonded onto a dicing tape. Thus, there is a problem that it is difficult to re-bond a semiconductor wafer without causing damage.

Meanwhile, in the technique of so-called pre-dicing in which grooves of a predetermined depth are previously formed along the streets in a semiconductor wafer and the back surface thereof is ground until the grooves are surfaced thereby dividing the wafer into a plurality of semiconductor chips, there is a need, prior to grinding, to bond the grooved semiconductor wafer on a rigid support substrate through an adhesive layer comparatively low in adhesion force, and, after grinding, to pick up semiconductor chips divided from the support substrate. In this case also, it is difficult to strip the semiconductor chips from the support substrate without causing damage.

Thus, it is an object of the present invention that, in the case of manufacturing thin semiconductor chips, the chips can be stripped from the support substrate without damage to the semiconductor wafer or semiconductor chips.

SUMMARY OF THE INVENTION

The present invention provides, as concrete means for solving the above problem, a method for manufacturing a semiconductor chip in which a semiconductor wafer, having a surface segmented by streets and formed with a plurality of circuits, is divided into circuit-based semiconductor chips, the method comprising: a support substrate integration step of bonding a front surface of a semiconductor wafer to a light-transmissive support substrate through an adhesive layer having an adhesion force that is reduced upon exposure to light radiation, thereby exposing a back surface of the semiconductor wafer; a grinding step of resting the semiconductor wafer integrated with the support substrate on a chuck table of a grinding device and grinding the back surface of the semiconductor wafer; a tape bonding step of bonding a tape on the back surface of the semiconductor wafer while the semiconductor wafer is integrated with the support substrate after the grinding step, and bonding a frame on a periphery of the tape; a re-bonding step of applying light radiation to the adhesive layer from a side of the support substrate before or after the tape bonding step to thereby reduce the adhesion force of the adhesive layer, and removing the support substrate and adhesive layer from the surface of the semiconductor wafer after the tape bonding step to thereby support the semiconductor wafer by the tape and the frame; and a dicing step of resting the semiconductor wafer supported by the tape and the frame on a chuck table of a dicing apparatus and cutting along the streets to segment the wafer into individual semiconductor chips.

Meanwhile, the invention provides a method for manufacturing a semiconductor chip in which a semiconductor wafer, having a surface segmented by streets and formed with a plurality of circuits, is divided into circuit-based semiconductor chips, the method comprising: a groove forming step of resting a semiconductor wafer on a chuck table of a dicing apparatus and forming grooves in a front surface of the wafer to segment the plurality of circuits; a support substrate integrating step of bonding a front surface of the semiconductor wafer to a light-transmissive support substrate through an adhesive layer having an adhesion force that is reduced upon exposure to light radiation, thereby exposing a back surface of the semiconductor wafer; a grinding step of resting the semiconductor wafer integrated with the support substrate on a chuck table of a grinding apparatus and grinding the back surface of the semiconductor wafer into individual semiconductor chips until the grooves are exposed through the back surface of the wafer; a tape bonding step of bonding a tape on the back surface of the semiconductor wafer while the wafer is integrated with the support substrate after the grinding step and maintaining an outer shape of the semiconductor wafer, and supporting a periphery of the tape by a frame; and a re-bonding step of applying light radiation to the adhesive layer at a side close to the support substrate before or after the tape bonding step to thereby reduce an adhesion force of the adhesive layer, and removing the supporting substrate and adhesive layer from the front surface of the semiconductor wafer after the tape bonding step thereby supporting the semiconductor wafer by the tape and the frame.

Furthermore, the invention provides a method for manufacturing a semiconductor chip in which a semiconductor wafer, having a surface segmented by streets and formed with a plurality of circuits, is divided into circuit-based semiconductor chips, the method comprising: a groove forming step of resting a semiconductor wafer on a chuck table of a dicing apparatus and forming grooves on a front surface of the wafer to segment the a plurality of circuits; a support substrate integrating step of bonding a front surface of the semiconductor wafer to a light-transmissive support substrate through an adhesive layer having an adhesion force that is reduced upon exposure to light radiation, thereby exposing a back surface of the semiconductor wafer; a grinding step of resting the semiconductor wafer integrated with the support substrate on a chuck table of a grinding apparatus and grinding the back surface of the semiconductor wafer into individual semiconductor chips until the grooves are exposed through the back surface of the wafer; and a semiconductor chip detaching step of applying light radiation to the adhesive layer at a side close to the support substrate to thereby reduce an adhesion force thereof, and removing semiconductor chips from the support substrate and adhesive layer.

The support substrate integrating step may be carried out using the support substrate having an outer shape greater than an outer shape of the semiconductor wafer, the grinding step being carried out while measuring a thickness of the semiconductor wafer by contacting probes of a thickness measuring instrument respectively with a grinding surface of the semiconductor wafer and with a surface of the support substrate.

The adhesive layer may be a liquid resin, the liquid resin being formed of a composition of quinone-diazido compound and resin to foam and reduce in adhesion force upon exposed to ultraviolet radiation, wherein the liquid resin is coated on the surface of the support substrate or the semiconductor wafer.

The quinone-diazido compound may be quinone-diazido sulphonic acid ester obtained by reacting polyhydroxy benzophenone, such as tri- or tetra-hydroxy benzophenone, with 1,2-naphtoquinone diazido-5-sulphonic acid, 1,2-naphtoquinone diazido-4-sulphonic acid, or sulphonic acid chloride thereof or the like, or at least one of sulphonic oxide compound selected from 1,2-quinone-diazido sulphonic acid or sulphonic acid chloride thereof or the like.

The resin may be at least one resin selected from acryl, urethane, polyester, novolak phenol and a derivative thereof, polyvinyl phenol and a derivative thereof, and silicone and a derivative thereof, the resin being introduced with polymeric unsaturated functional group.

Also, the liquid resin may have a viscosity of 10–100000 mPa·s. Further, in the support substrate integrating step, the liquid resin may be dripped on the surface of the support substrate or the semiconductor wafer and spin-coated under rotation at 100–8000 rpm for 5 seconds or more, and thereafter the semiconductor wafer and the support substrate are united together through the liquid resin and baked at 50–150° C. for 30 seconds to 20 minutes.

Furthermore, the support substrate may be formed by a transparent plate of glass or plastic having a thickness of 0.5–2.5 mm.

In the method for manufacturing a semiconductor chip configured as described above, a semiconductor wafer is bonded to a rigid support substrate through an adhesive layer having an adhesion force that is reduced upon exposure to light radiation. In such a state, grinding is carried out to make the semiconductor wafer a desired thickness. Thereafter, light radiation is applied to the support substrate to thereby lower the adhesion force of the adhesive layer. Due to this, the semiconductor wafer or semiconductor chip is detached from the support substrate. Accordingly, the semiconductor wafer or semiconductor chips even if thinned can be easily removed without encountering damage.

Particularly, in the case that the adhesive layer is a liquid resin and the resin is formed of a composition of quinone-diazido compound and resin to foam and be reduced in adhesion force upon exposure to ultraviolet radiation, ultraviolet radiation is applied to the support substrate thereby concentrating a foaming region and forming a gap between the semiconductor wafer or semiconductor chips and the adhesive layer. Accordingly, detachment is made easier and safer from the support substrate.

DETAILED DESCRIPTION OF PREFERRED EMBODIMENT

Figure 1:
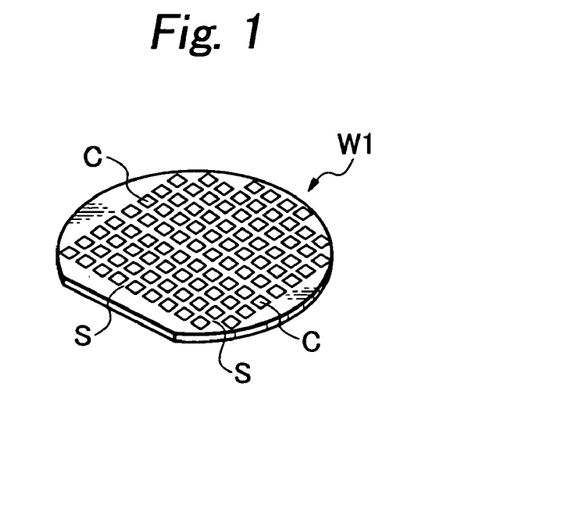
FIG. 1 is a perspective view showing a semiconductor wafer.

As an embodiment of the present invention, explanation is made of a method in which the semiconductor wafer W1, segmented by streets S and formed with a plurality of circuits C, is divided into individual semiconductor chips, as shown in FIG. 1.

Figure 2:
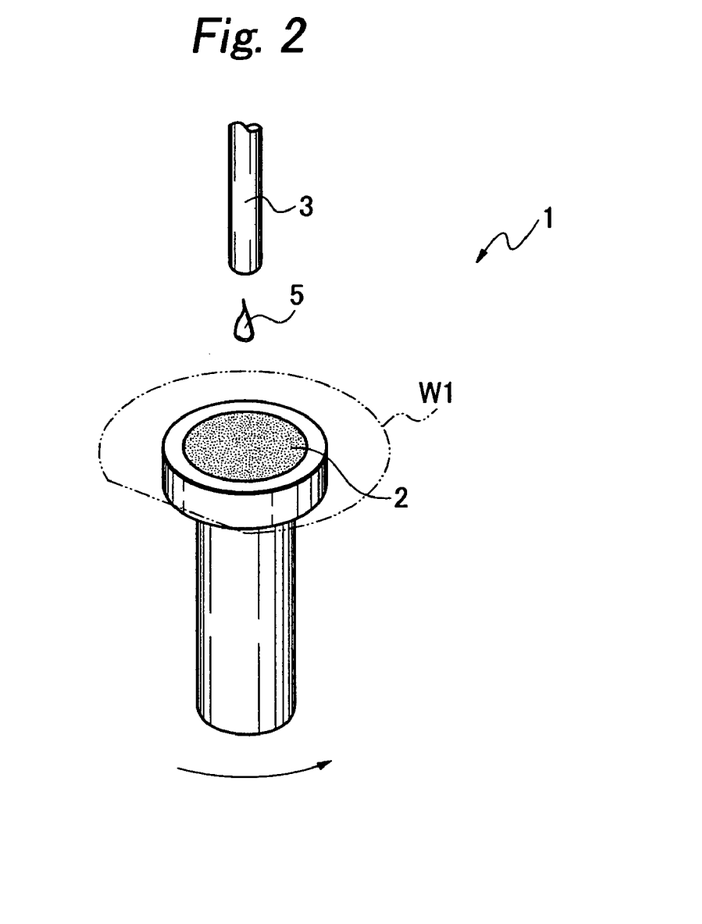
FIG. 2 is a perspective view showing a manner in which liquid resin is spin-coated to the surface of the semiconductor wafer.

At first, a spin coater 1, for example, shown in FIG. 2 is used, to coat an adhesive layer having an adhesion force that is reduced upon exposure to light, e.g. liquid resin adhesive layer 10, over the surface of a semiconductor wafer W1 or support substrate 11. The explanation herein is of a case in which liquid resin 5 is coated to the surface of the semiconductor wafer W1.

Figure 3:
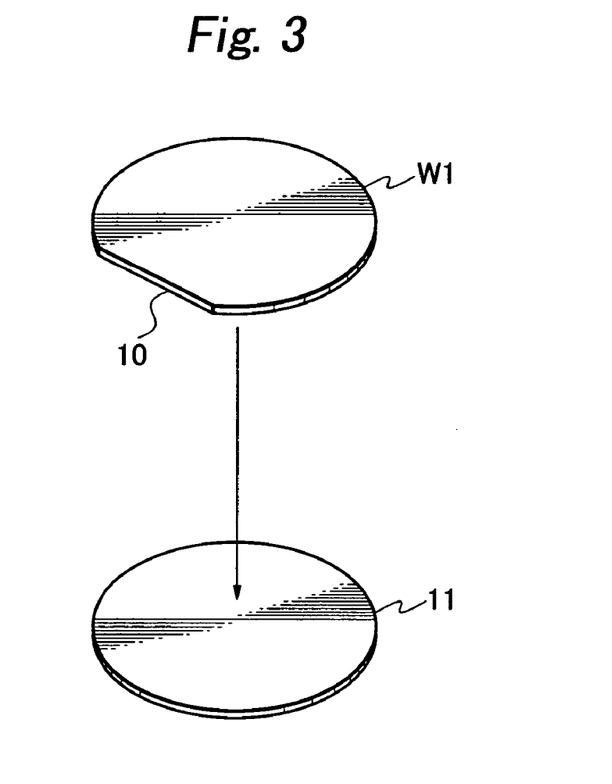
FIG. 3 is a perspective view showing a manner in which the semiconductor wafer is integrated with a support substrate through an adhesive layer.

The spin coater 1 has at least a rotatable support table 2 and a drip part 3 for allowing liquid resin 10 to drip. The semiconductor wafer W1 is held face up on the support table 2. While the support table 2 is rotated at a rotation speed, for example, of 100–8000 rpm for 5 seconds or more, liquid resin is allowed to drip through the drip part 3, to carry out spin coating. Due to this, liquid resin 5 is uniformly coated over the surface of the semiconductor wafer W1, to form an adhesive layer 10, as shown in FIG. 3. Thereafter, the support substrate 11 is united with the semiconductor wafer 11 through the adhesive layer 10, and baked at 50–150° C. for 30 seconds to 20 minutes, thereby fixing the semiconductor wafer W1 and the support substrate together.

As the liquid resin 5, a composition of quinone-diazido compound and resin can be used to foam and lower in adhesion force upon exposed to ultraviolet radiation. As the quinone-diazido compound, quinone-diazido sulphonic acid ester obtained by reacting polyhydroxy benzophenone, such as tri- or tetra-hydroxy benzophenone, with 1,2-naphtoquinone diazido-5-sulphonic acid, 1,2-naphtoquinone diazido-4-sulphonic acid, or sulphonic acid chloride thereof or the like, or 1,2-quinone-diazido sulphonic acid or sulphonic acid chloride thereof or the like can be used. Meanwhile, as the resin, for example, acryl, urethane, polyester, novolak phenol or a derivative thereof, polyvinyl phenol or a derivative thereof, silicone or a derivative thereof, or such a resin introduced with polymeric unsaturated radical can be used. The liquid resin desirably has a viscosity of 10–100000 mPa·s.

Figure 4:
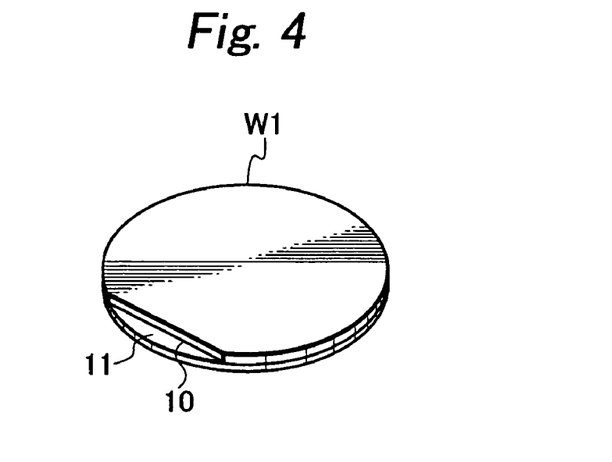
FIG. 4 is a perspective view showing a state that the semiconductor wafer is integrated with the support substrate through the adhesive layer.

After forming the adhesive layer 10 on the surface of the semiconductor wafer W1 as described above, the semiconductor wafer W1 is inverted and the semiconductor wafer W1 at its surface is bonded to and integrated with the support substrate 11 through the adhesive layer 10, as shown in FIG. 3. This is baked for a predetermined time into a state as shown in FIG. 4 (support substrate integration process). Here, the support substrate 11 is formed by a transparent plate of glass, plastic or the like transmissive to light and having a rigidity in such a degree that can stably support even the semiconductor wafer thinned down to 100 μm or less, 50 μm or less by grinding to be carried out later. This has a thickness of approximately 0.5 mm–2.5 mm for example.

Figure 5:
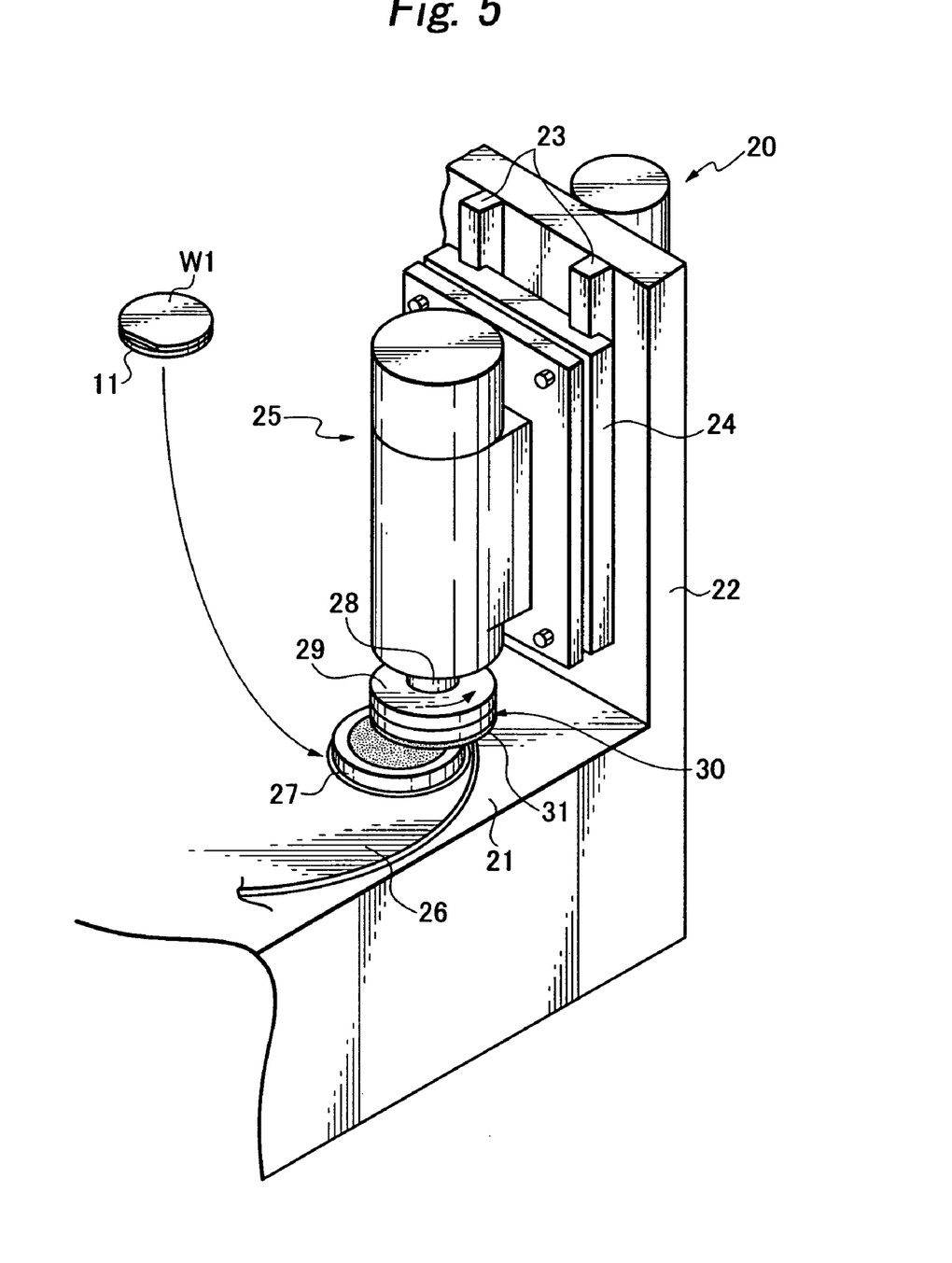
FIG. 5 is a perspective view showing an example of a grinding apparatus to be used in an embodiment of the invention.

Then, the semiconductor wafer W1 is ground at its backside by using a grinding device 20 shown in FIG. 5, for example. In the grinding device 20, a wall part 22 is provided rising at an end of a base 21. A pair of rails 23 is vertically arranged on the inner surface of the wall part 22. By vertically moving a support 24 along the rails 23, a grinding means 25 attached on the support 24 is moved vertically. Meanwhile, a turntable 26 is rotatably arranged on the base 21. Furthermore, the turntable 26 rotatably sustains thereon a chuck table 27 for holding a semiconductor wafer.

The grinding means 25 has a mounter 29 attached at the tip of a spindle 28 having a vertical axis, and a grinding wheel 30 fixed to the underside thereof. A grindstone 31 is fixed on the underside of the grinding wheel 30. The grindstone 31 is rotated with rotation of the spindle 28.

When grinding the back surface of the semiconductor wafer W1 by the use of the grinding device 20, the semiconductor wafer W1 supported on the support substrate 11 is rested on the chuck table 27 in a state exposed at the back surface. Then, the semiconductor wafer W1 is positioned immediately beneath the grinding means 25. The spindle 28 is rotated and the grinding means 25 is descended. With rotation of the spindle 28 at high speed, the grinding wheel 30 is rotated at the high speed. The rotating grindstone 31 goes into contact with and exerts pressure to the semiconductor wafer. Thus, the back surface is ground by the grindstone 31 into a predetermined thickness (grinding process).

Figure 6:
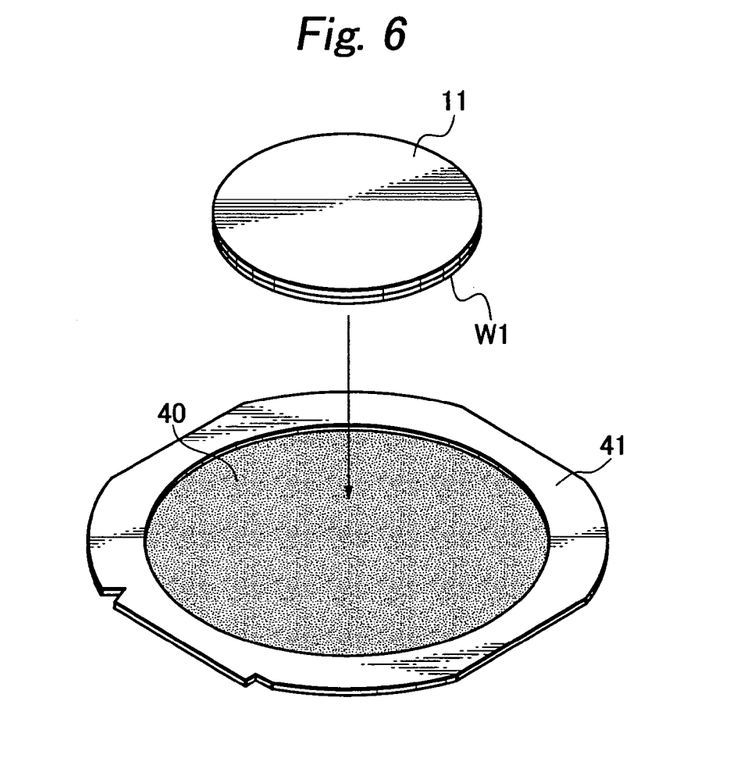
FIG. 6 is a perspective view showing a manner in which the post-grinding semiconductor wafer integrated with the support substrate is bonded to a tape.

After carrying out the grinding process in this manner, the semiconductor wafer W1 integral with the support substrate 11 is inverted and bonded onto the adhesive surface of a tape 40, as shown in FIG. 6.

A frame 41 is bonded on a periphery of the tape 40 to support the periphery of the tape 40. By bonding the back surface of the semiconductor wafer W1 supported on the support substrate 11 to the tape 40, these are formed into one body (tape bonding process).

Figure 7:
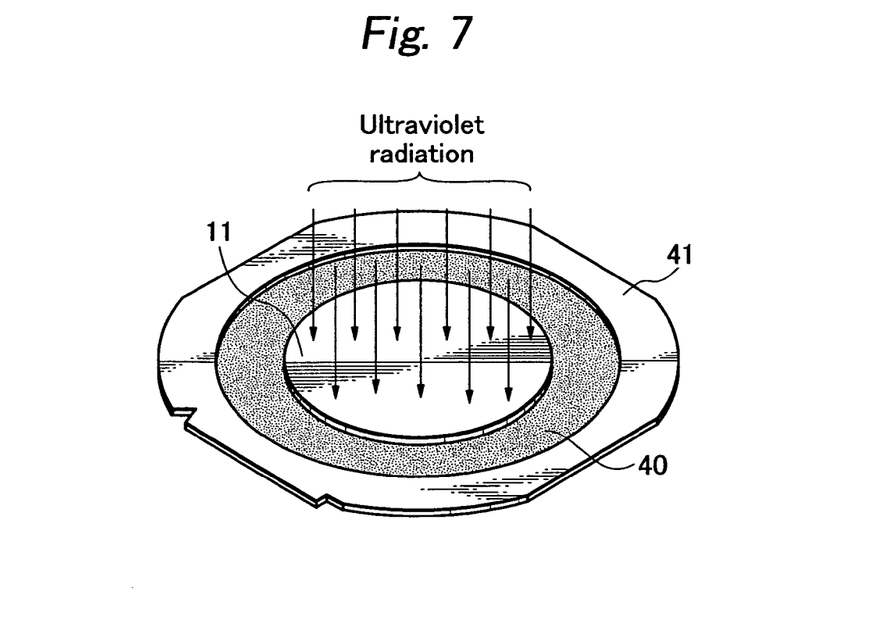
FIG. 7 is a perspective view showing a manner in which ultraviolet radiation is applied to the support substrate.

Then, as shown in FIG. 7, ultraviolet radiation is applied from above of the support substrate 11. Because the support substrate 11 is formed by a plate of glass, plastic or the like transmissive to light, radiation light transmits through the support substrate 11 and reaches the adhesive layer 10 to cause it to foam.

Figure 8:
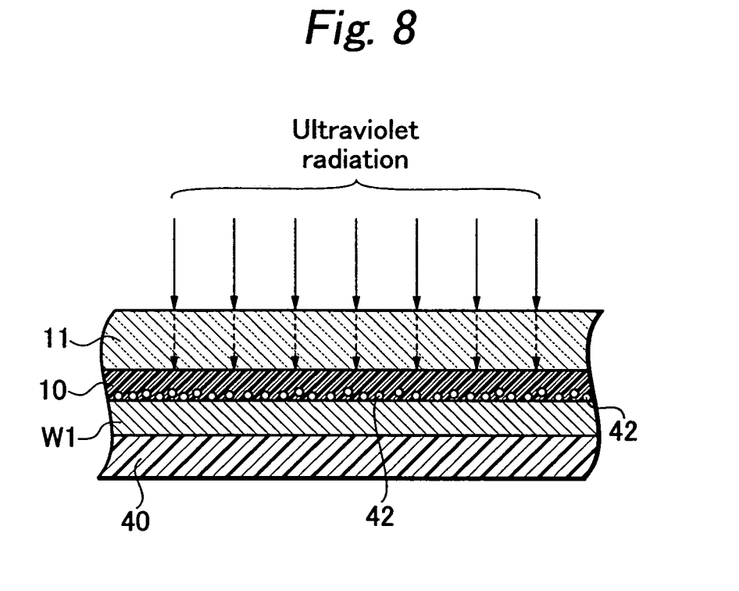
FIG. 8 is a sectional view showing a state in which foaming takes place in the adhesive layer due to exposure to ultraviolet radiation.

The adhesive layer 10 is made of a composition of quinone diazido compound and resin. Consequently, when light incident on the support substrate 11 travels toward the semiconductor wafer W1, the adhesive layer 10 is cured gradually from the side close to the support substrate 10. As shown in FIG. 8, a foamed region 42 concentrates at a side close to the semiconductor wafer W1, to form a gap between the adhesive layer 10 and the semiconductor wafer W1 and hence lower the adhesion force.

Figure 9:
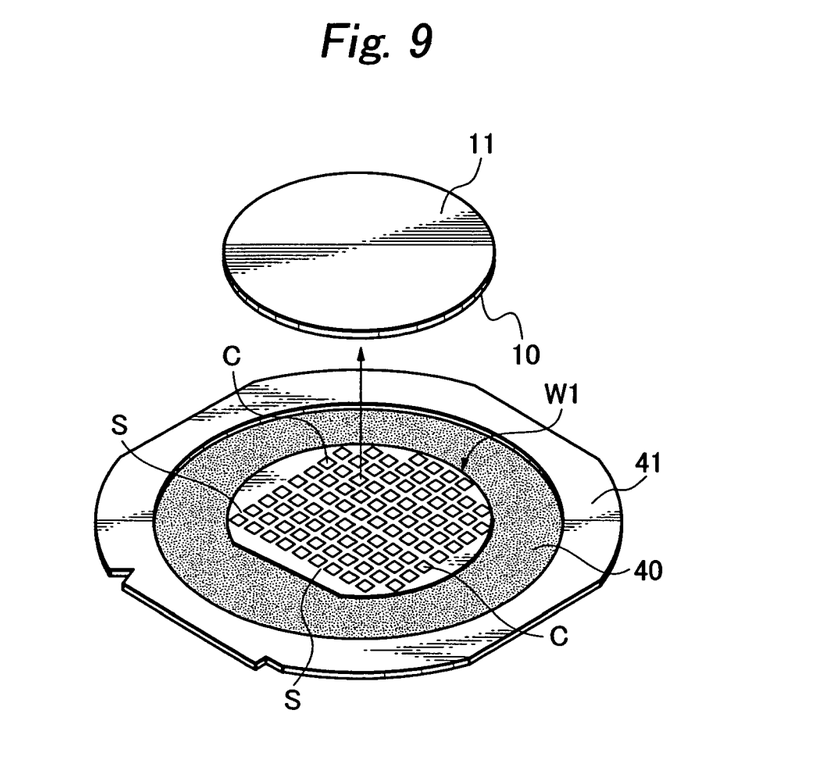
FIG. 9 is a perspective view showing a manner in which the support substrate is removed from the semiconductor wafer.

Then, the support substrate 11 is lifted, as shown in FIG. 9. Thereupon, because the adhesive layer 10 is lowered in adhesion force, the support substrate 11 and adhesive layer 10 can be readily removed from the semiconductor wafer W1. There is no fear of causing damage to the semiconductor wafer W1. After detaching the support substrate 11 in this manner, the semiconductor wafer W1 stays in a state bonded on the tape 40, thus being held by the tape 40 and frame 41 (re-bonding process). In this manner, in the re-bonding process, the support substrate 11 is detached after lowering the adhesion force of the adhesive layer 10 by the application of light radiation. The semiconductor wafer, even if thinned by grinding, can be easily re-bonded to the tape 40 and held by the tape 40 and frame 41. Incidentally, light radiation to the adhesive layer 10 may be carried out prior to the tape bonding process.

Figure 10:
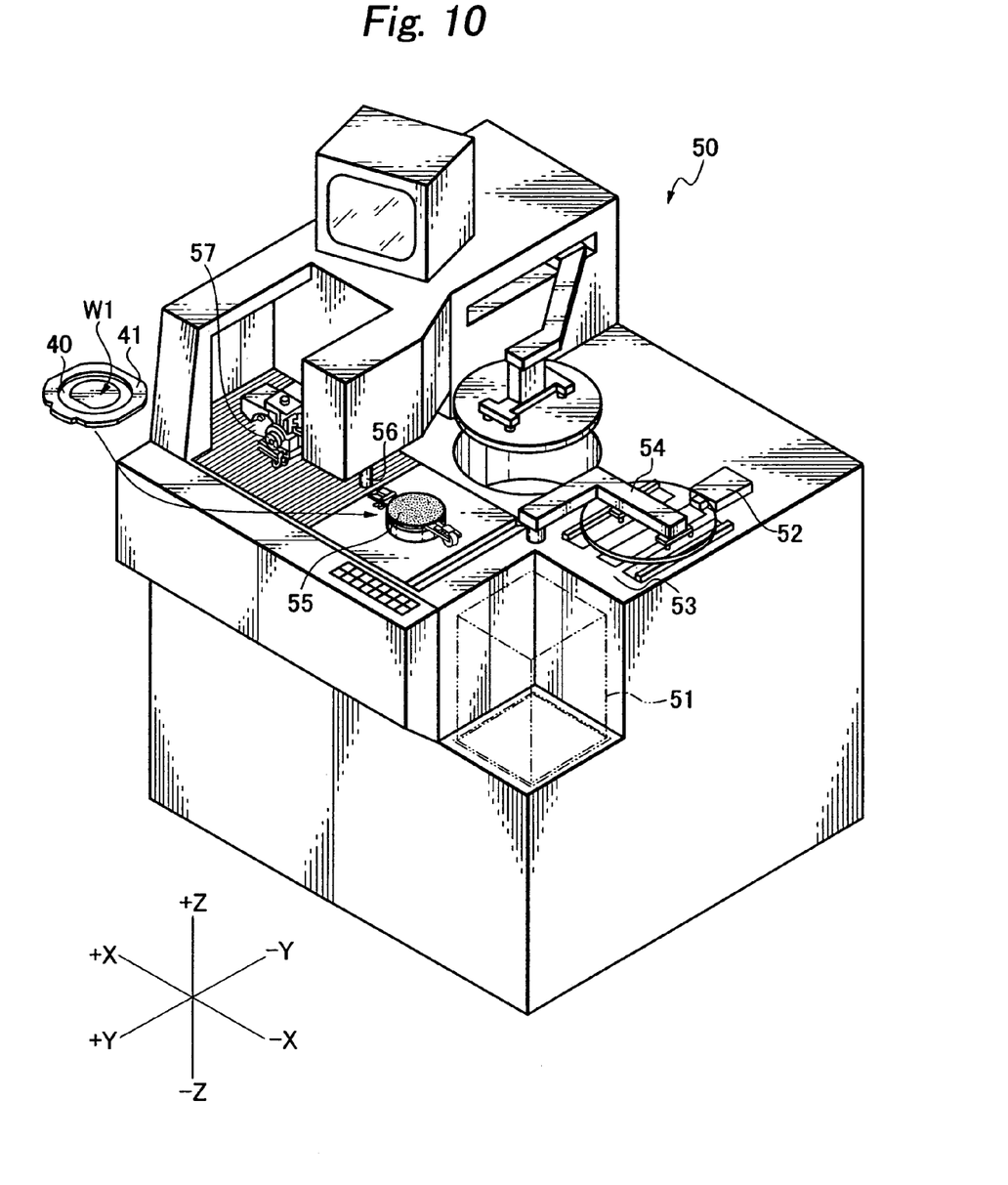
FIG. 10 is a perspective view showing an example of a dicing apparatus to be used in dicing the semiconductor wafer.

The semiconductor wafer W1, held on the tape 40 and frame 41 as described above, can be divided into individual semiconductor chips by using a dicing apparatus 50, for example, as shown in FIG. 10.

In the dicing apparatus 50, a plurality of semiconductor wafer W1 integrated with the frame 41 through the tape 40 are accommodated within a cassette 51. The semiconductor wafer W1 integrated with the frame 41 is carried, by transport means 52, from the cassette 51 into a resting state at a temporary repository 53 where it is held by suction by first transport means 54 which swivels to deliver the semiconductor wafer W1 and frame 41 to the chuck table 55 where it rests and is held by suction.

When the semiconductor wafer W1 is held by suction on the chuck table 55, the chuck table 55 moves in a +X direction into a position immediately beneath alignment means 56. A street S to be cut is detected by a process of pattern matching or the like. The relevant street S is aligned with a rotary blade 57 with respect to a Y-axis direction. After such positioning, the chuck table 55 furthermore moves in the X-axis direction whereby cutting is performed by the action of the rotary blade 57.

Figure 11:
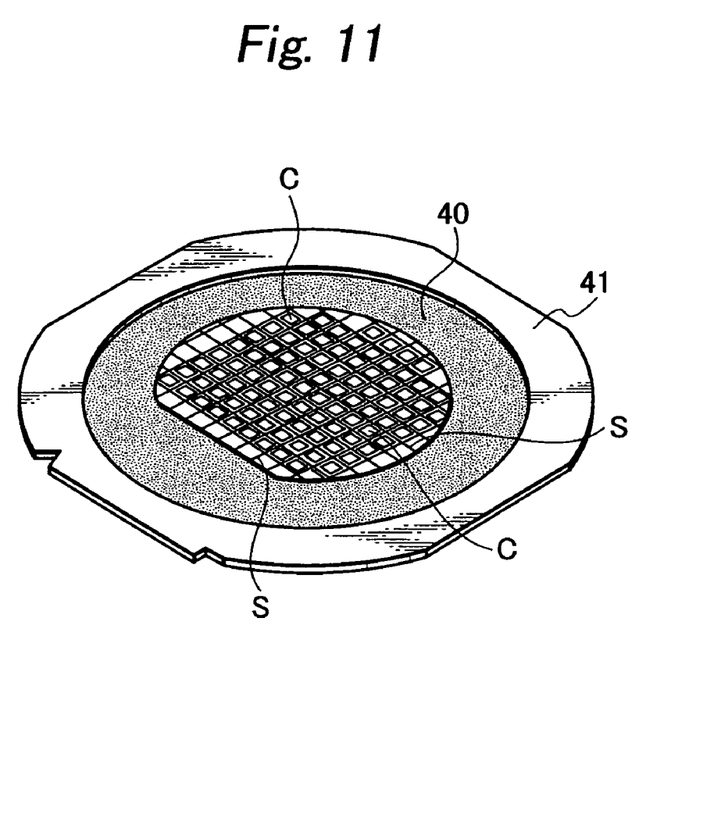
FIG. 11 is a perspective view showing a semiconductor wafer after dicing.

Cutting is carried out in this manner while feeding the rotary blade 57 by indexing at a street interval in the Y-axis direction. Furthermore, in case the chuck table 55 is rotated 90 degrees to carry out similar cutting, cutting is done lengthwise and widthwise on all the streets S, resulting in divided individual semiconductor chips C (dicing process).

The steps constituted by the support substrate integration process, the grinding process, the tape bonding process, the re-bonding process and the dicing process are carried out in the above manner. The semiconductor wafer W1 in a state supported on the rigid support substrate 11 is ground to a desired thickness and thereafter, light radiation is applied to the support substrate 11 to reduce the adhesion force of the adhesive layer 10, thereby detaching the semiconductor wafer W1 from the support substrate 11 and re-bonded to the tape 40. Accordingly, the semiconductor wafer W1 even when thinned by grinding, can undergo processes up to dicing without being damaged by the same. Then, individual semiconductor chips C can be picked up.

Now a case in which a semiconductor chip is manufactured by a so-called pre-dicing technique will be explained.

Figure 12:
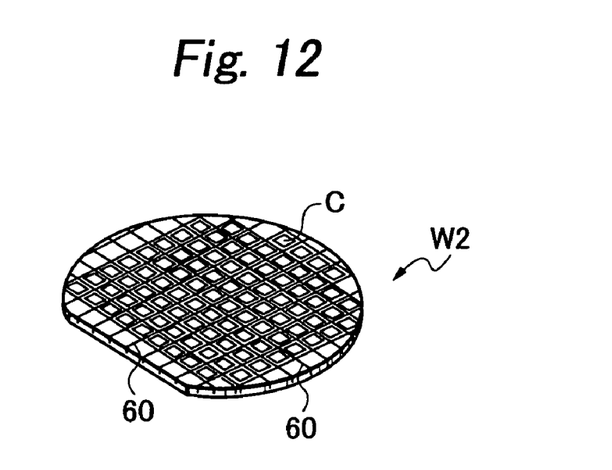
FIG. 12 is a perspective view showing a semiconductor wafer formed with grooves on the surface thereof.
Figure 13:
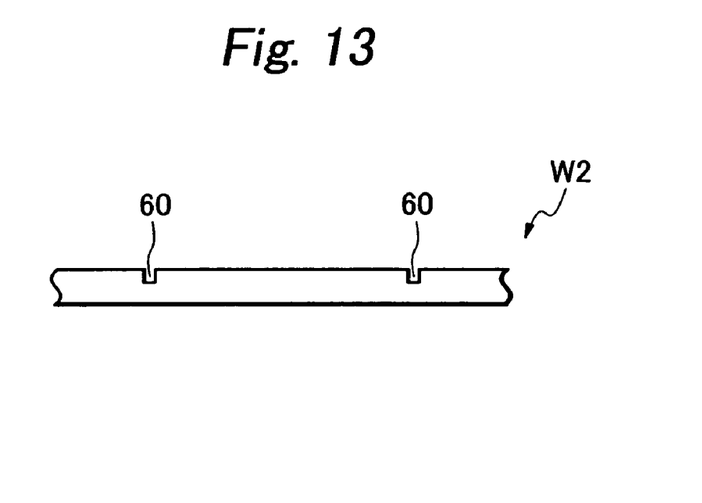
FIG. 13 is a front view showing a semiconductor wafer formed with grooves on the surface thereof.

At first, a semiconductor wafer is rested on the chuck table 55 of the dicing apparatus 50 shown in FIG. 10, for example. By using the rotary blade 57, grooves 60 are formed in the streets S on the surface of the semiconductor wafer W2, as shown in FIGS. 12 and 13. Thus, a semiconductor wafer W2 is formed with the grooves having a depth corresponding to the thickness of the final semiconductor chip C (groove forming process).

Figure 14:
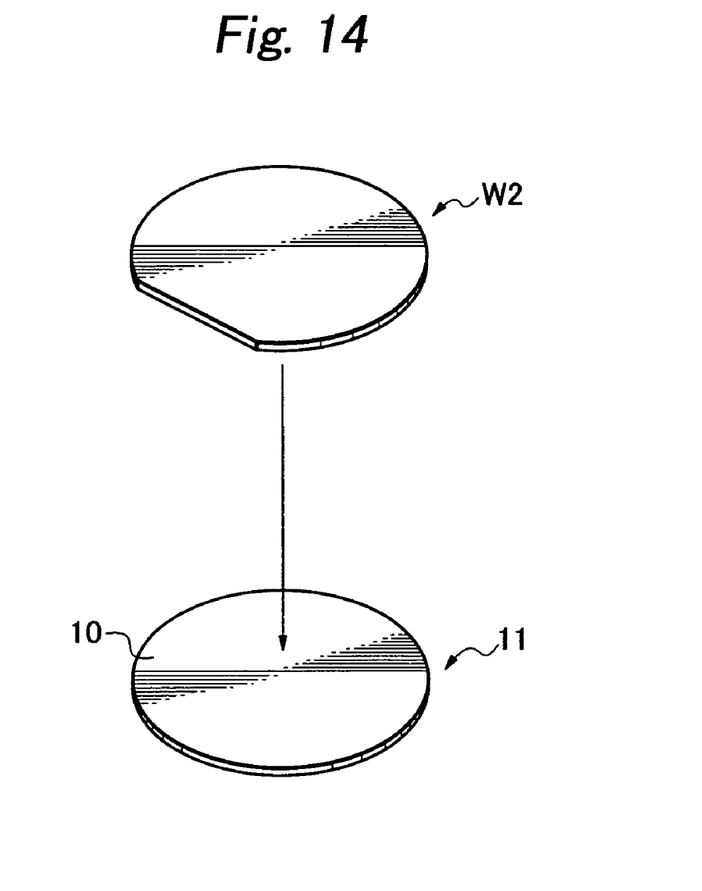
FIG. 14 is a perspective view showing a manner in which the semiconductor wafer formed with grooves on the surface is integrated with the support substrate through an adhesive layer.
Figure 15:
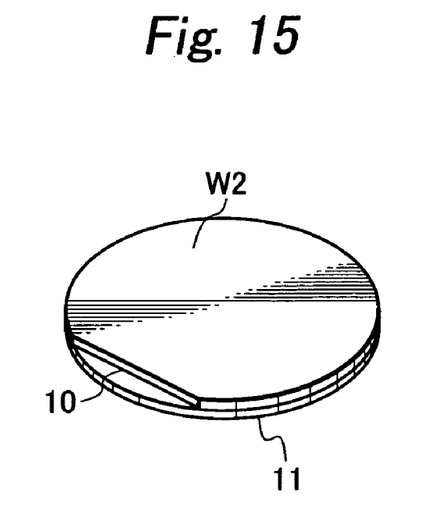
FIG. 15 is a perspective view showing a state in which the same semiconductor wafer and the support substrate are integrated through the adhesive layer.

Then, the spin coater 1 shown in FIG. 2 is used to provide a coating of adhesive layer on the surface of the support substrate 11. As shown in FIG. 14, the semiconductor wafer W2 is inverted. The semiconductor wafer W2 at the surface is bonded to the support substrate 11 through the adhesive layer 10 into one body. This body is baked for a predetermined time into a state shown in FIG. 15 (support substrate integration process).

Figure 16:
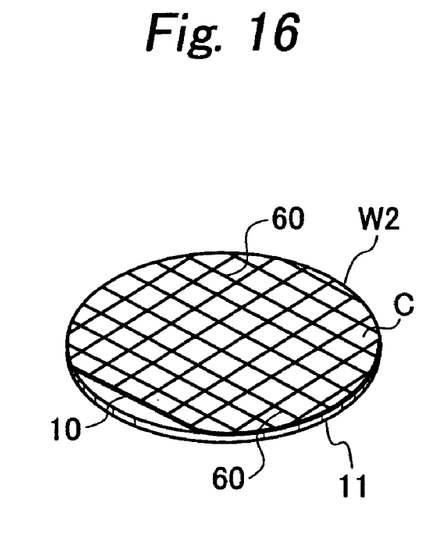
FIG. 16 is a perspective view showing a state in which the semiconductor wafer whose grooves are surfaced by back grinding is supported by the support substrate.

The semiconductor wafer W2 integrated with the support substrate 11 is rested on the chuck table 27 of the grinding device 20 shown in FIG. 5. By using the grinding means 25, the back surface of the semiconductor wafer W2 is ground to surface the grooves 60 on the back surface of the semiconductor wafer W2. This provides division into individual semiconductor chips in a state maintaining, as a whole, the outer shape of the semiconductor wafer W2, as shown in FIG. 16 (grinding process).

Figure 17:
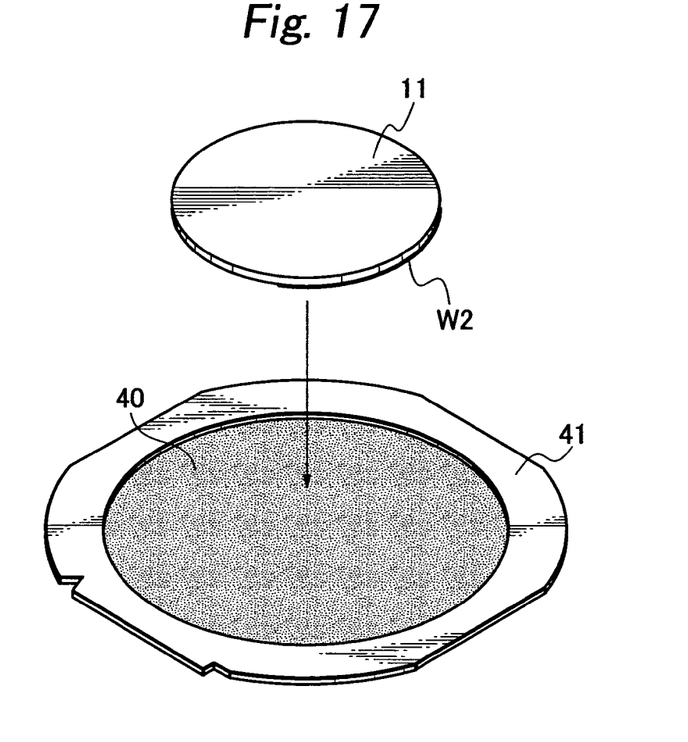
FIG. 17 is a perspective view showing a manner in which the same semiconductor wafer is bonded to a tape.

After carrying out the grinding process in this manner, the semiconductor wafer W2 integrated with the support substrate 11 is inverted inside up. The semiconductor wafer W2 at its back surface is bonded to an adhesive surface of a tape 40 having a frame 41 bonded onto its periphery (tape bonding process).

Figure 18:
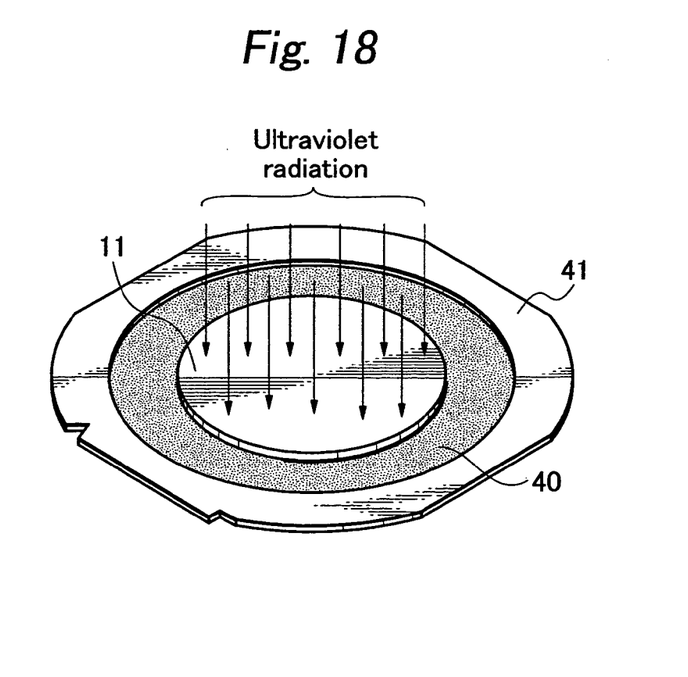
FIG. 18 is a perspective view showing a manner in which ultraviolet radiation is applied to the support substrate.

Then, light radiation is applied to the support substrate 11 from above, as shown in FIG. 18. Because the support substrate 11 is formed by a light-transmissive plate of glass, plastic or the like, the radiation light transmits through the support substrate 11 and reaches the adhesive layer 10 to foam it.

Figure 19:
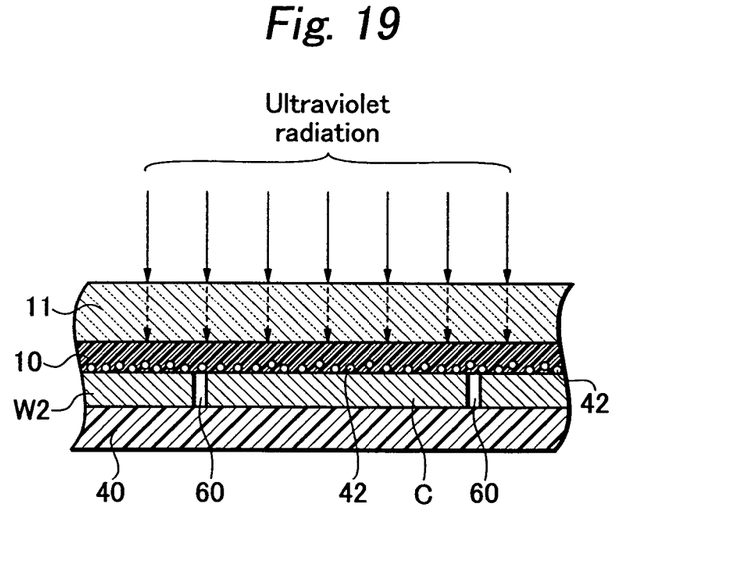
FIG. 19 is a sectional view showing a state in which foaming takes place in the adhesive layer due to exposure to ultraviolet radiation.

The adhesive layer 10 is made of a composition of quinone-diazido compound and resin. Accordingly, when light incident on the support substrate 11 travels toward the semiconductor wafer W2, the adhesive layer 10 is cured gradually from a side close to the support substrate 11. As shown in FIG. 19, a foamed region concentrates at a side close to the semiconductor wafer, forming a gap between the adhesive layer and the semiconductor wafer W2. This reduces the adhesion force.

Figure 20:
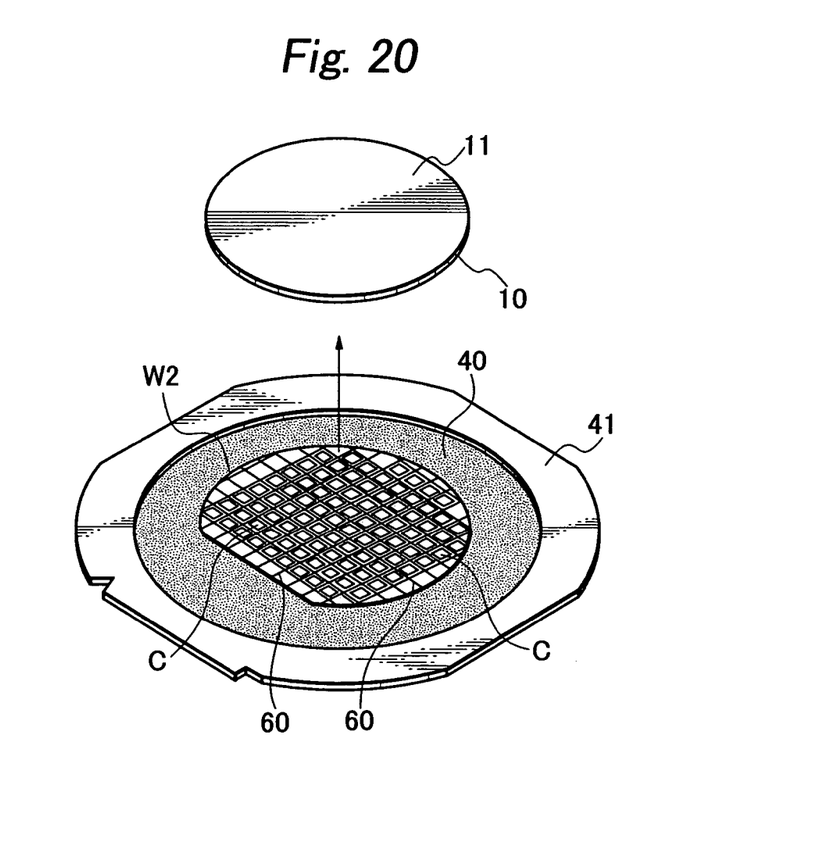
FIG. 20 is a perspective view showing a manner in which the support substrate is removed from the semiconductor wafer.

After reducing the adhesion force, the support substrate 11 is lifted up as shown in FIG. 20. Thereupon, the support substrate 11 can be readily stripped off the semiconductor wafer W2 because the adhesion force is lowered in the adhesive layer 10. There is no fear of damage to the individual chip. By thus detaching the support substrate 11, all the semiconductor chips C are bonded on the tape 40 while keeping the outer shape of the semiconductor wafer W2. Thus, they are held by the tape 40 and frame 41 (re-bonding process).

In this manner, in the re-bonding process, the support substrate 11 is detached after reducing the adhesion force in the adhesive layer 10 by applying light radiation thereto. This makes it possible to easily re-bond the semiconductor wafer on the tape 40 even when thinned by grinding. In this state, the semiconductor chips C bonded on the tape 40 can be picked up individually. Incidentally, the application of light radiation to the adhesive layer 10 can be performed prior to the tape bonding process.

Figure 21:
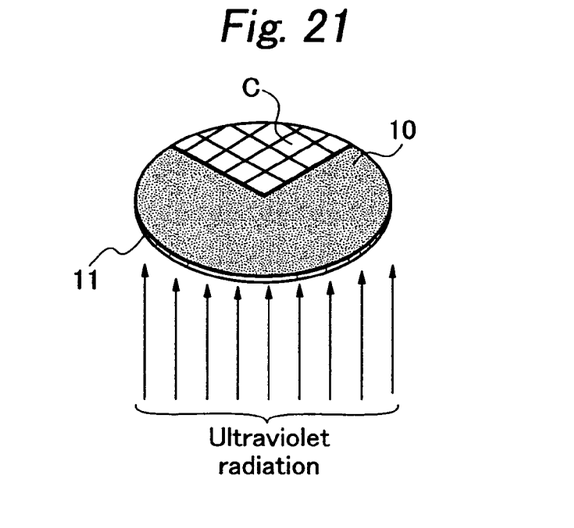
FIG. 21 is a perspective view showing a manner in which ultraviolet radiation is applied to the support substrate thereby allowing picking up of the semiconductor chips.

In the above embodiment, the semiconductor chips were picked up after performing the tape bonding process and re-bonding process following the grinding process. However, the semiconductor chips C can be picked up without carrying out the tape bonding process and re-bonding process. In this case, ultraviolet radiation is applied to the support substrate 11 to thereby reduce the adhesion force in the adhesive layer 10, as shown in FIG. 21. This allows the semiconductor chips C to be smoothly picked up from the support substrate 11.

In grinding the semiconductor wafer W1, W2, there is a need to measure a thickness of the semiconductor wafer W1, W2, in order to provide a desired thickness to the finally formed semiconductor chips.

Figure 22:
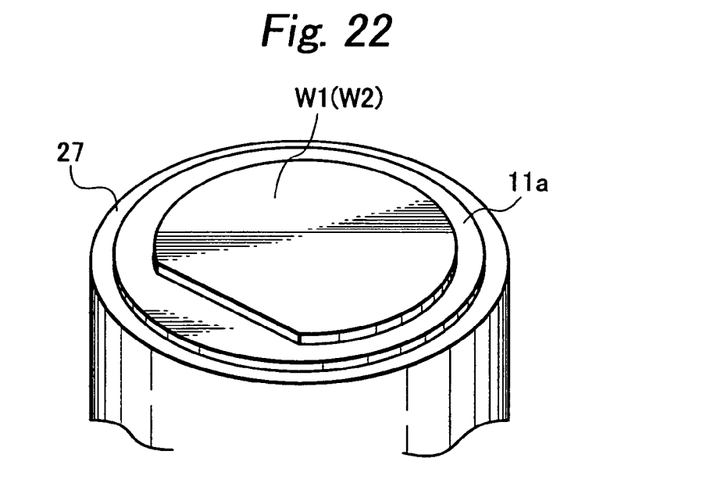
FIG. 22 is a perspective view showing a manner in which the semiconductor substrate is supported by the use of a support substrate greater in outer shape than the semiconductor wafer.
Figure 23:
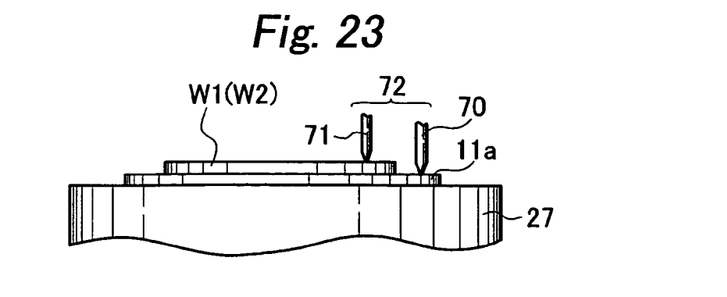
FIG. 23 is a front view showing a manner in which a thickness of the semiconductor wafer is measured while held on the support substrate by using a thickness-measuring instrument.

For this reason, the support substrate 11a can be made greater in outer shape than the semiconductor wafer W1 (W2) as shown FIG. 22. The semiconductor wafer W1 (W2) supported by the support substrate 11a is held on the chuck table 27 of the grinding device 20 shown in FIG. 5. As shown in FIG. 23, a probe 70 is put in contact with the surface of the support substrate 11a while a probe 71 is put in contact with the back surface of the support substrate 11a.

The probe 70 and the probe 71 constitute a thickness-measuring instrument 72 capable of determining a thickness of the semiconductor wafer W1 (W2) depending upon a difference in height between those. By forming the support substrate 11a greater than semiconductor wafer W1 (W2), the thickness of the semiconductor substrate W1 (W2) can be measured in this manner at any time. In the case that the grinding process is performed while measuring the thickness of the semiconductor wafer W1 (W2), it is possible to correctly manage the final thickness of the semiconductor chip C.

Incidentally, the above explanation was of the example in which the semiconductor wafer is cut along the streets by the use of a rotary blade thereby being divided into a plurality of semiconductor chips or formed grooves thereon. However, it is possible to use a laser beam in dividing a wafer into semiconductor chips or forming grooves therein. Hence, the present invention is applicable to both a dicing apparatus using a rotary blade and a dicing apparatus using a laser beam.

As explained above, in the method for manufacturing a semiconductor chip according to the present invention, a semiconductor wafer is bonded to a rigid support substrate through an adhesive layer that has its adhesion force reduced upon exposure to light radiation. In such a state, grinding is carried out to make the semiconductor wafer a desired thickness. Thereafter, light radiation is applied to the support substrate to thereby lower the adhesion force of the adhesive layer. Due to this, the semiconductor wafer or semiconductor chip is detached from the support substrate. Accordingly, the semiconductor wafer or semiconductor chip even if thinned can be easily removed without encountering damage. It is possible to manufacture semiconductor chips with greater safety and reliabiity.

Particularly, in the case in which the adhesive layer is formed of a liquid resin and the resin is formed of a composition of quinone-diazido compound and resin to foam and lower in adhesion force upon exposure to ultraviolet radiation, ultraviolet radiation is applied to the support substrate thereby concentrating a foaming region and forming a gap between the semiconductor wafer or semiconductor chip and the adhesive layer. Accordingly, detachment from the support substrate is made easier and safer.

What is claimed is:

1. A method for manufacturing semiconductor chips in which a semiconductor wafer, having a surface segmented by streets and formed with a plurality of circuits, is divided into individual circuit-based semiconductor chips, the method comprising:

a support substrate integration step of bonding a front surface of a semiconductor wafer to a light-transmissive support substrate through an adhesive layer having an adhesion force that is reduced upon exposure to light radiation, thereby exposing a back surface of the semiconductor wafer;

a grinding step of resting the semiconductor wafer integrated with the support substrate on a chuck table of a grinding device and grinding the back surface of the semiconductor wafer;

after the grinding step, performing a tape bonding step of bonding a tape on the back surface of the semiconductor wafer while the semiconductor wafer is integrated with the support substrate and bonding a frame on a periphery of the tape;

after the tape bonding step, performing a re-bonding step of applying light radiation to the adhesive layer from a side of the support substrate to thereby reduce the adhesion force of the adhesive layer, and removing the support substrate and adhesive layer from the front surface of the semiconductor wafer to thereby support the semiconductor wafer by the tape and the frame; and a dicing step of resting the semiconductor wafer supported by the tape and the frame on a chuck table of a dicing apparatus and cutting along the streets to segment the semiconductor wafer into the individual semiconductor chips.

2. A method according to claim 1, wherein the support substrate that is bonded to the semiconductor wafer in the support substrate integrating step has an outer shape greater than an outer shape of the semiconductor wafer, the grinding step being carried out while measuring a thickness of the semiconductor wafer by contacting probes of a thickness measuring instrument respectively with a grinding surface of the semiconductor wafer and with a surface of the support substrate.

3. A method according to claim 1, wherein the adhesive layer is formed by a liquid resin, the liquid resin being formed of a composition of quinone-diazido compound and resin to foam and reduce in adhesion force upon exposure to ultraviolet radiation, wherein the liquid resin is coated on the surface of the support substrate or the semiconductor wafer.

4. A method according to claim 3, wherein the quinone-diazido compound is quinone-diazido sulphonic acid ester obtained by reacting polyhydroxy benzophenone, such as tri- or tetra-hydroxy benzophenone, with 1,2-naphtoquinone diazido-5-sulphonic acid, 1,2-naphtoquinone diazido-4-sulphonic acid, or sulphonic acid chloride thereof or the like, or at least one of sulphonic oxide compound selected from 1,2-quinone-diazido sulphonic acid or sulphonic acid chloride thereof or the like.

5. A method according to claim 3, wherein the resin is at least one resin selected from acryl, urethane, polyester, novolak phenol and a derivative thereof, polyvinyl phenol and a derivative thereof, and silicone and a derivative thereof, the resin being introduced with polymeric unsaturated radical.

6. A method according to claim 5, wherein the liquid resin has a viscosity of 10–100000 mPa·s.

7. A method according to claim 3, wherein, in the support substrate integrating step, the liquid resin is dripped on the surface of the support substrate or the semiconductor wafer and spin-coated under rotation at 100–8000 rpm for 5 seconds or more, and thereafter the semiconductor wafer and the support substrate are united together through the liquid resin and baked at 50–150° C. for 30 seconds to 20 minutes.

8. A method according to any of claim 1, wherein the support substrate is formed by a transparent plate of glass or plastic having a thickness of 0.5–2.5 mm.

9. A method for manufacturing semiconductor chips in which a semiconductor wafer, having a surface segmented by streets and formed with a plurality of circuits, is divided into individual circuit-based semiconductor chips, the method comprising:

a groove forming step of resting a semiconductor wafer on a chuck table of a dicing apparatus and forming grooves in a front surface of the semiconductor wafer to segment the plurality of circuits;

a support substrate integrating step of bonding the front surface of the semiconductor wafer to a light-transmissive support substrate through an adhesive layer having an adhesion force that is reduced upon exposure to light radiation, thereby exposing a back surface of the semiconductor wafer;

a grinding step of resting the semiconductor wafer integrated with the support substrate on a chuck table of a grinding apparatus and grinding the back surface of the semiconductor wafer until the grooves are exposed through the back surface of the semiconductor wafer to segment the semiconductor wafer into individual semiconductor chips;

after the grinding step, performing a tape bonding step of bonding a tape on the back surface of the semiconductor wafer while the semiconductor wafer is integrated with the support substrate and maintaining an outer shape of the semiconductor wafer, and supporting a periphery of the tape by a frame; and after the tape bonding step performing a re-bonding step of applying light radiation to the adhesive layer at a side close to the support substrate to thereby reduce an adhesion force of the adhesive layer, and removing the support substrate and adhesive layer from the front surface of the semiconductor wafer such that the semiconductor wafer is supported by the tape and the frame.

10. A method according to claim 9, wherein the adhesive layer is formed by a liquid resin, the liquid resin being formed of a composition of quinone-diazido compound and resin to foam and reduce in adhesion force upon exposure to ultraviolet radiation, wherein the liquid resin is coated on the surface of the support substrate or the semiconductor wafer.

11. A method according to claim 10, wherein the resin is at least one resin selected from acryl, urethane, polyester, novolak phenol and a derivative thereof, polyvinyl phenol and a derivative thereof, and silicone and a derivative thereof, the resin being introduced with polymeric unsaturated radical.

12. A method according to claim 10, wherein the quinone-diazido compound is quinone-diazido sulphonic acid ester obtained by reacting polyhydroxy benzophenone, such as tri- or tetra-hydroxy benzophenone, with 1,2-naphtoquinone diazido-5-sulphonic acid, 1,2-naphtoquinone diazido-4-sulphonic acid, or sulphonic acid chloride thereof or the like, or at least one of sulphonic oxide compound selected from 1,2-quinone-diazido sulphonic acid or sulphonic acid chloride thereof or the like.

13. A method according to claim 11, wherein the liquid resin has a viscosity of 10–100000 mPa·s.

14. A method according to claim 9, wherein the support substrate that is bonded to the semiconductor wafer in the support substrate integrating step has an outer shape greater than an outer shape of the semiconductor wafer, the grinding step being carried out while measuring a thickness of the semiconductor wafer by contacting probes of a thickness measuring instrument respectively with a grinding surface of the semiconductor wafer and with a surface of the support substrate.

15. A method according to claim 10, wherein, in the support substrate integrating step, the liquid resin is dripped on the surface of the support substrate or the semiconductor wafer and spin-coated under rotation at 100–8000 rpm for 5 seconds or more, and thereafter the semiconductor wafer and the support substrate are united together through the liquid resin and baked at 50–150° C. for 30 seconds to 20 minutes.

16. A method according to any of claim 9, wherein the support substrate is formed by a transparent plate of glass or plastic having a thickness of 0.5–2.5 mm.

* * * * *